United States Patent [19]

Sapsford et al.

[11] Patent Number: 5,083,090
[45] Date of Patent: Jan. 21, 1992

[54] CONTACTLESS MEASUREMENT OF THE ELECTRICAL RESISTANCE PER UNIT LENGTH OF FILAMENTS

[75] Inventors: Gary S. Sapsford, Bishop's Stortford Herts; Alan Robinson, Harlow, both of Great Britain

[73] Assignee: STC PLC, London, England

[21] Appl. No.: 531,791

[22] Filed: May 31, 1990

[30] Foreign Application Priority Data

May 31, 1989 [GB] United Kingdom ............... 8912458

[51] Int. Cl.$^5$ ............................................. G01R 27/04
[52] U.S. Cl. .................................. 324/632; 324/629; 324/637
[58] Field of Search ............... 324/629, 632, 633, 635, 324/637, 642, 644, 639, 71.1, 602, 707

[56] References Cited

U.S. PATENT DOCUMENTS

| | | | |
|---|---|---|---|
| 3,739,263 | 6/1973 | Henoch | 324/644 X |
| 4,425,542 | 1/1984 | Tsaliovich et al. | |
| 4,492,915 | 1/1985 | Caspers | 324/637 X |
| 4,623,835 | 11/1986 | Mehdizadeh et al. | 324/644 X |

FOREIGN PATENT DOCUMENTS

| | | |
|---|---|---|
| 0583999 | 1/1947 | United Kingdom . |
| 1351964 | 5/1974 | United Kingdom . |
| 2052760 | 1/1982 | United Kingdom . |

Primary Examiner—Kenneth A. Wieder
Attorney, Agent, or Firm—Lee, Mann, Smith, McWilliams & Sweeney

[57] ABSTRACT

A non-contacting method of measuring the electrical resistance per unit length of a filament, such as a carbon-coated optical fibre, makes the filament the inner conductor of a co-axial transmission line and measures a propagation characteristic of that line. The transmission line may be divided into seven sections, with a signal injected on the second section, and a comparison of the resulting signals appearing on the fourth and sixth sections being used in a feedback loop to control the injected signal frequency in such a way as to hold constant either the relative amplitudes or the relative phases of the signals appearing at the fourth and sixth sections.

16 Claims, 5 Drawing Sheets

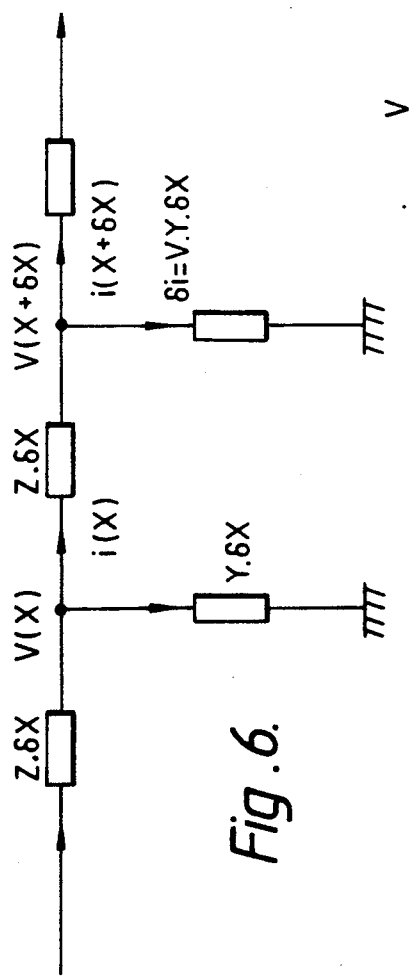

CONTACTLESS MEASUREMENT OF THE ELECTRICAL RESISTANCE PER UNIT LENGTH OF FILAMENTS

BACKGROUND OF THE INVENTION

This invention relates to the measurement of the electrical resistance per unit length of a filament, and finds particular application in situations in which it is inconvenient or impossible to make direct electrical contact with the conductive filament. A particular example of an instance where direct electrical contact is either undesirable or impossible concerns making measurements of electrical resistance per unit length of electrically conductive coatings, for instance carbon coatings, applied to optical fibres. In this instance, direct contact with the coating may be undesirable for risk of damaging the strength of the fibre, or because the electrically conductive coating has already itself been coated with a dielectric protective coating, for instance, of plastics material.

During the manufacture of an optical fibre with a hermetic coating of carbon, it is desirable that the thickness of the carbon coating is monitored. One approach is to measure the conductance of the fibre, which, for thin coatings of conductivity $\sigma$, is proportional to the thickness t.

$$\text{conductance per unit length} = 2\pi a t \sigma \quad (t < < a) \quad (1)$$

where a is the fibre radius.

FIG. 1 depicts how an existing design of tensometer can be adapted to enable the making of direct current on-line measurement of electrical resistance per unit length. In this tensometer, the optical fibre 10 passes over two guide wheels 11 and 12 between which the fibre is deflected by a resiliently biased tensometer wheel 13. The tensometer is adapted by replacing the original wheels 11 and 12 with graphite wheels, and by connecting a resistance meter 14 across the graphite wheels using sliding contacts 15. As indicated previously, the drawback of this approach is that the direct contact between the carbon coating and the tensometer wheels is liable to damage the coating and hence impair the strength of the fibre, whereas, if the carbon is provided with a plastics protective coating prior to passing through the tensometer, the presence of this protective coating prevents direct electrical contact between the carbon coating and the graphite wheels.

If, instead of using direct current to make the measure, alternating current were to be used, then at least in principle, contactless capacitive coupling can replace the graphite wheels of FIG. 1. However, in practice the fibre will also be susceptible to capacitive coupling with other parts of the fibre drawing equipment, as indicated schematically in FIG. 2 and in the equivalent circuit diagram of FIG. 3. In FIGS. 2 and 3, $Z_A$ and $Z_B$ are largely capacitive impedances, the product of interaction with the surrounding equipment of the fibre either side of the coupling capacitances $C_{in}$ and $C_{out}$. Both the potential induced on the fibre, $V_f$, derived from an oscillator 20 providing an a.c. signal $V_i$, and the fraction of $V_f$ tapped out to give the output signal, $V_1$, depend on the magnitudes of the stray impedances $Z_A$ and $Z_B$.

In order to calculate the fibre resistance R unambiguously, it is necessary either to know the stray impedances $Z_A$ and $Z_B$, or to use multiple probes to derive both the potential on the fibre $V_f$ and its rate of change. For this purpose, two capacitive taps, $C_1$ and $C_2$, respectively tapping off signals $V_1$ and $V_2$ fed to buffer amplifiers 40, may be employed as indicated in FIG. 4. Some form of screening 41 between the oscillator and the taps will also be necessary to reduce direct capacitive coupling between the oscillator and the taps. The equivalent circuit is illustrated in FIG. 5.

SUMMARY OF THE INVENTION

It is an object of the present invention to enable contactless measurement of the elctrical resistance per unit length of filaments to be made by means of alternating current measurements without needing to have to evaluate the magnitudes of impedances associated with stray couplings between the filament and its surroundings.

It is a further object of the present invention to enable contactless evaluation of the thickness of an electrically conductive coating of known resistivity present upon the surface of an electrically insulating filament of known cross-section, particularly though not necessarily a hermetic coating, for instance of carbon, present upon the surface of an optical fibre.

It is another object of the present invention to provide apparatus for the contactless making of the measurement of the resistance per unit length of filaments by means of alternating current measurements, the resistance per unit length being capable of being evaluated without needing to have to know the magnitudes of impedances associated with stray coupling effects between the filament and component parts of the apparatus or other nearby objects.

In pursuance of these objectives and others the filament is made the inner conductor of a co-axial transmission line, and a measure of resistance per unit length is derived from measuring a propagation constant of a signal injected on to that line. The propagation constant employed in such an evaluation may be the attenuation coefficient or the propagation wavelength at a particular frequency, or alternatively the frequency providing a particular value of attenuation coefficient or propagation wavelength.

Instead of analysing the signal appearing on the line at just one point spaced from where a signal is injected on to the line, it is generally preferred to effect a comparison between the signals appearing at two successive points on the line, and it is particularly preferred to use the result of the comparison in a feedback loop to control the frequency of the output of an oscillator driving the system, so as to maintain a constant amplitude ratio or a constant phase relationship between the signals at those two points on the line. Thus advantageously the transmission line is divided into a number of sections. Power is coupled into one of these sections, an injection section, and a comparison is made between the consequential signals appearing respectively at two other sections, measurement sections, that are a known distance apart. It is further advantageous to arrange for the comparison of the two signals to control the operation of a feedback loop regulating the frequency of the injected signal coupled into the injection signal so as to provide a predetermined amplitude or phase difference between those two signals.

BRIEF DESCRIPTION OF THE DRAWINGS

FIG. 6 is an equivalent circuit of an infinitesimal length of transmission line, FIG. 7 is a diagram of a transmission line terminated with a lumped impedance, FIG. 8 is a diagram of a resistance meter which is a transmission line equivalent of the diagram of the meter of FIG. 2.

DETAILED DESCRIPTION OF PREFERRED EMBODIMENTS

Resistance meters embodying the invention in preferred forms are described below. This description is prefaced with a description of the underlying principles of operation with particular reference to transmission line theory.

Reference has already been made to FIGS. 1 to 4 of the accompanying drawings, and now in the ensuing description, reference is additionally made to FIGS. 6 to 10.

Figure 3:
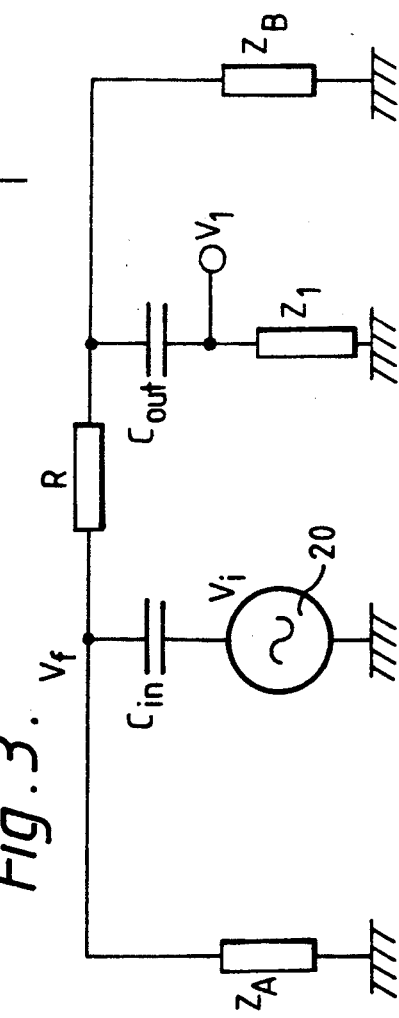
FIG. 3 depicts the equivalent circuit for the apparatus of FIG. 2.
Figure 4:
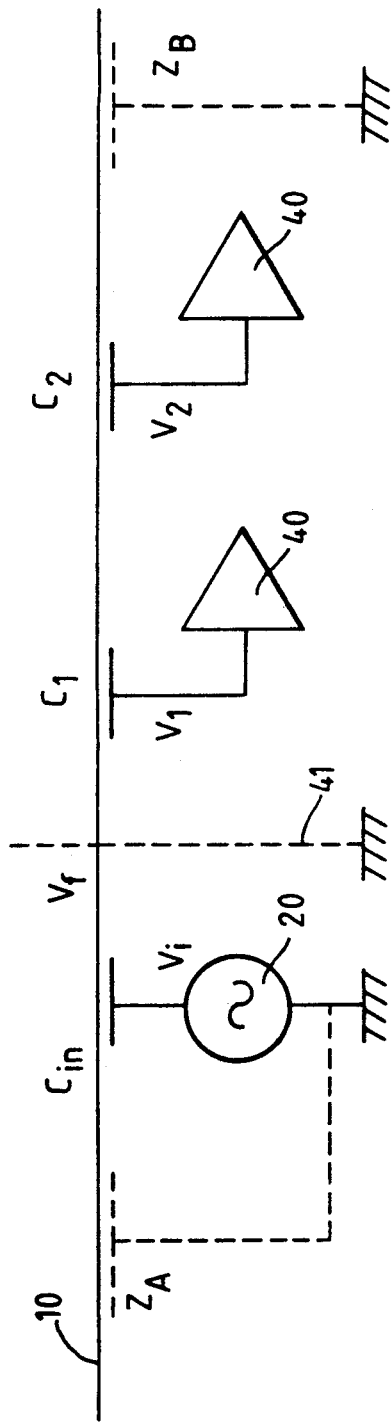
FIG. 4 is a diagram of a variant of the apparatus of FIG. 2.
Figure 5:
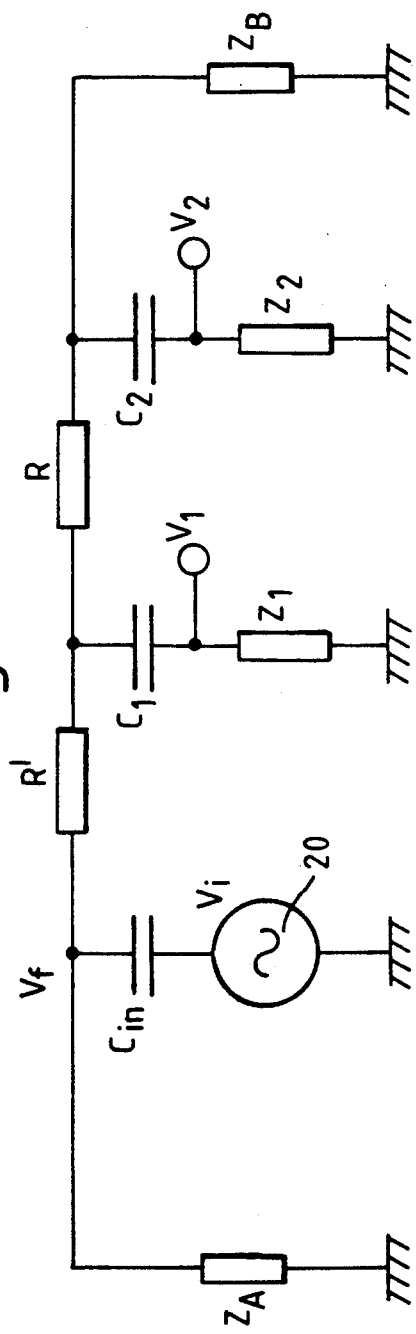
FIG. 5 depicts the equivalent circuit for the apparatus of FIG. 4.

The capacitative coupling between the conductive coating on an optical fibre and its surroundings, is distributed in nature, and hence propagation of an electrical signal along it is not accurately predicted by the lumped impedances shown in FIGS. 3 and 5. A more appropriate model treats the fibre as a lossy transmission line. The properties of a uniform transmission line are fully determined by the series inductance and resistance per unit length, and by the parallel capacitance and conductance per unit length. For the case of a cylindrical central conductor of radius a, surrounded by a co-axial second conductor or screen of radius b, these are as follows:

Series inductance per unit length
$$L = \frac{\mu\mu_o}{2\pi} \ln \frac{b}{a}$$

Parallel capacitance per unit length
$$C = \frac{2\pi\epsilon\epsilon_o}{\ln \frac{b}{a}}$$

Series resistance per unit length $R$
Parallel conductance per unit length $G$

In a non-contacting fibre conductivity measuring device, it will generally be required that the radius of the bore of the instrument, b, be substantially greater than the fibre radius, a. Because of the logarithmic variation of the impedances with size, the transmission line characteristics will, in such circumstances, be relatively insensitive to small changes in diameter. The behaviour of non-circular devices will be similar, with b approximately equal to the clearance between the fibre and the conducting walls of the device.

Consider a signal of angular frequency $\omega$ propagating down the transmission line.

voltage $v = v_o \exp j(\omega t - kx)$ (2)

current $i = i_o \exp j(\omega t - kx)$ (3)

For a lossy guide, the propagation constant, k, will be complex.

$$k = \beta - j\alpha \qquad (4)$$

At angular frequency $\omega$:

Series impedance per unit length
$$Z = R + j\omega L \qquad (5)$$

Parallel admittance per unit length
$$Y = G + j\omega C \qquad (6)$$

For most cases of interest here, the parallel conductance, G, corresponding to a leaky or lossy dielectric, can be ignored. FIG. 6 shows the series and parallel elements in an infinitesimal length $\delta x$ of transmission line.

In the limit $\delta x \rightarrow 0$:

$$\frac{dv}{dx} = -i \cdot Z \qquad (7)$$

$$\frac{di}{dx} = -v \cdot Y \qquad (8)$$

Eliminating i and v from the differential equations:

$$-k^2 i = \frac{d^2 i}{dx^2} = -y\frac{dv}{dx} = iYZ \qquad (9)$$

$$-k = RG - \omega^2 LC + j\omega(RC + LG) \qquad (10)$$

In the case of a lossless transmission line, $R = G = 0$, in which case $$k = \beta = \omega\sqrt{LC} \qquad (11)$$

Under these circumstances the signals propagate with velocity $$u = \frac{\omega}{\beta} = \frac{1}{\sqrt{LC}}$$

equal to the velocity of light in the dielectric between the conductors.

In the present instance, it is desired to measure a finite series resistance per unit length, R, and it is generally valid to assume that $G = 0$. It is convenient to define a quality factor, Q, equal to the ratio of the oscillatory and dissipative terms.

$$Q = \frac{\omega^2 LC}{\omega RC} = \frac{\omega L}{R} \qquad (12)$$

so that $$k^2 = -j\omega RC (1 + jQ) \qquad (13)$$

For a 125 μm fibre in a 5 mm bore conducting cylinder, b/a=40, and assuming $\mu = \epsilon = 1$, L=0.74 μH m$^{-1}$ C=15 pF m$^{-1}$ (14)

The resistance of typical coatings is around 1MΩ m$^{-1}$, so $Q = (7.4 \times 10^{-13}\omega)$ is very much less than unity and, for all frequencies below 100 MHz, will be small even with fibre resistances as low as 1kΩ/m. It follows that the real and imaginary parts of the propagation constant k are approximately equal.

$$k = \pm(1-j)\sqrt{\frac{\omega RC}{2}(1+jQ)} \quad (15)$$

At a frequency of 1 MHz:

$$\alpha \approx \beta \approx 7 \text{m}^{-1} \quad (16)$$

Over a distance of $1/\alpha$ ($\approx 14$ cm) the signal amplitude will decrease by a factor $1/e \approx 0.37$, and the phase will change by 1 radian. This contrasts with the lossless guide in which the phase change per unit length is only 0.02, corresponding to a wavelength of 300 m.

An important parameter in predicting the power coupled into or out of a transmission line is the characteristic impedance, $Z_o$, defined as the ratio of the potential between the conductors, and the current flowing through them:

$$Z_o = \frac{v}{i} = \frac{jk}{Y} = \sqrt{\frac{Z}{Y}} \quad (17)$$

$$= \pm(1-j)\sqrt{\frac{R}{2\omega C}(1+jQ)} \quad (18)$$

The signs of k and $Z_o$ are positive for waves travelling in the direction of increasing axial distance, x, and negative for waves in the opposite direction. $Z_o$ is the impedance presented at one end of an infinitely long transmission line, or of a transmission line terminated by an impedance equal to $Z_o$.

If a transmission line of finite length is unmatched at one end, then the impedance presented at the other end will depend on the terminating impedance, the length of the transmission line, and the frequency of operation. In the case of a finite length of co-axial transmission line constituted by a portion of carbon coated optical fibre, where that fibre threads a conducting tube, the terminating impedance will be determined by the shape and proximity of conducting metalwork around the fibre beyond the tube. If that terminating impedance is not a matching impedance, then power is reflected back from the impedance discontinuity, as shown in FIG. 7.

Incident wave $v_1 = A \exp j(\omega t - kx)$ (19)

$$i_1 = \frac{v_1}{Z_o} \quad (20)$$

Reflected wave $v_2 = A' \exp j(\omega t + kx)$ (21)

$$i_2 = -\frac{v_2}{Z_o} \quad (22)$$

At the terminating impedance $(x = 0)$

-continued $$Z_a = \frac{v_1 + v_2}{i_1 - i_2} = \frac{A + A'}{A - A'} Z_o \quad (23)$$

Reflection coefficient $$\rho = \frac{A'}{A} = \frac{Z_a - Z_o}{Z_a + Z_o} \quad (24)$$

It will be noted from the above that when the terminating impedance $Z_a$ is a matching impedance, i.e. $Z_a = Z_o$, the reflection coefficient is zero.

At the input to the transmission line $x = -s$, $$Z_i = \frac{v}{i} = Z_o \frac{e^{jks} + \rho e^{-jks}}{e^{jks} - \rho e^{-jks}} \quad (25)$$

In a conventional low loss (high Q) transmission line, the amplitude of the factor $\rho e^{-2jks}$ can be almost unity, resulting in large variations in $Z_i$. However in the present instance, attention is not directed to low loss transmission lines, and it is possible to choose dimensions and operating frequency so that the reflected wave is severely attenuated. For $\alpha s >> 1$ $$Z_i \approx Z_o \left(1 + 2\frac{Z_a - Z_o}{Z_a + Z_o} e^{-2\alpha s} e^{-2j\beta s}\right) \quad (26)$$

If $\alpha s > 2$, then variations in terminating impedance will produce less than $+4\%$ variation in $Z_i$ under worst case conditions (open circuit or short circuit). Similarly, provided the measurement taps are arranged near the centre of a transmission line whose length is at least a few multiples of $1/\alpha$, any external noise at the measurement frequency will be severely attenuated.

Figure 2:
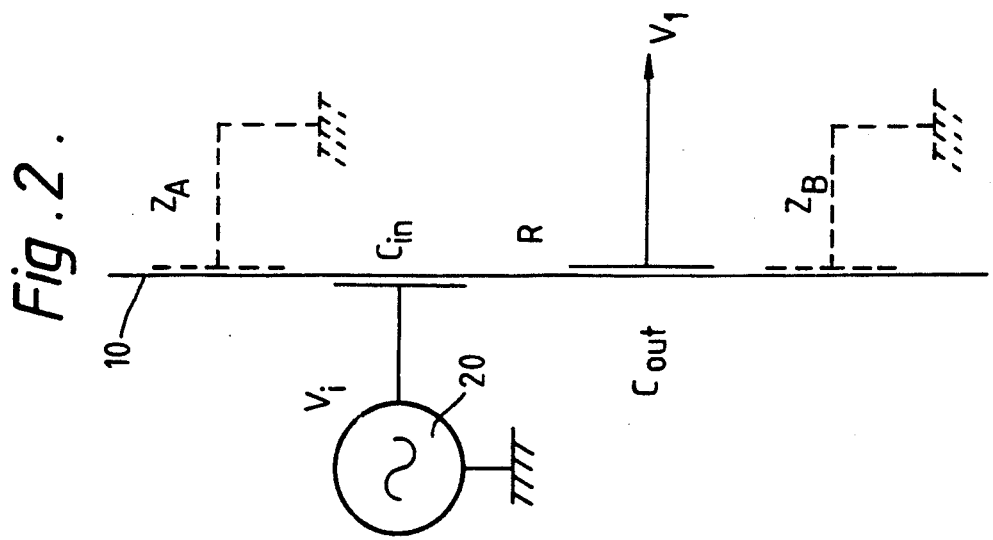
FIG. 2 is a diagram of apparatus which can in principle be used for making alternating current resistance measurements.
Figure 1:
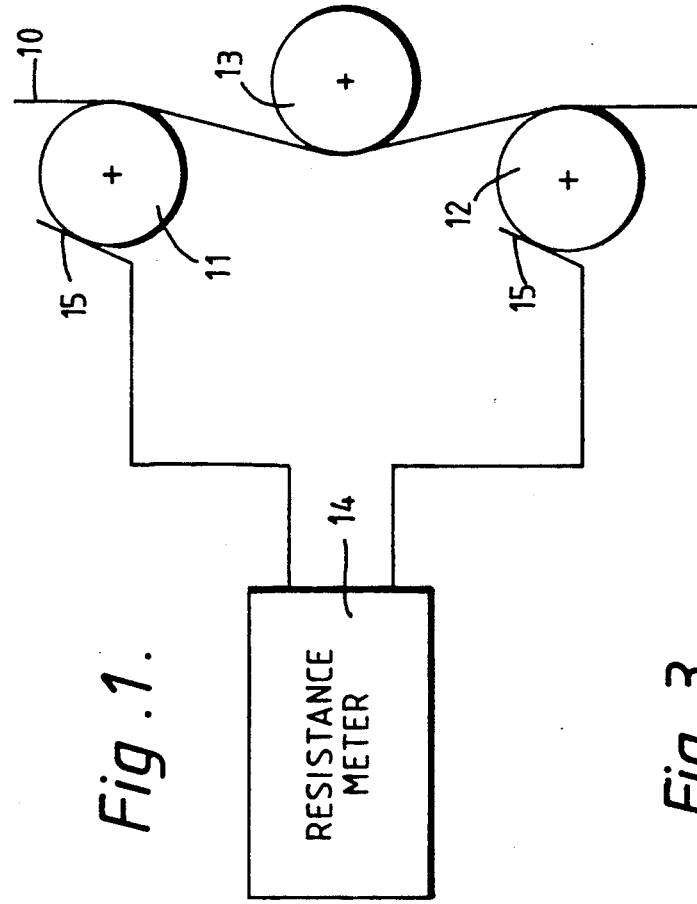
FIG. 1 is a diagram of apparatus suitable for making direct current resistance measurements.

Applying the foregoing considerations, FIG. 8 is a diagram of an example of the basic single measurement tap type resistance meter of FIG. 2 implemented in co-axial transmission line format. In this meter of FIG. 8 the carbon coated optical fibre 10 threads five sections 80 to 84 of conductive tubing arranged in echelon. Each section 80 to 84 co-operates with the portion of fibre 10 threading it to form a length of transmission line of the same characteristic impedance, $Z_o$. An alternating signal from oscillator 20 is applied to the system via section 81, and a portion of this signal is tapped from the system via section 83, and is fed to buffer amplifier 40. One end of section 81 terminates adjacent the end of section 80, and section 80 is made long enough in comparison with $1/\alpha$ (typically $>2/\alpha$) to make it appear as a substantially matched termination for section 81 irrespective of the value of $Z'_A$, the stray impedance provided by coupling between the fibre and its surroundings beyond the end of section 80. Similarly section 84 is made long enough to make it appear as a substantially matched termination for section 83 irrespective of the value of $Z'_B$, the stray impedance provided by coupling between the fibre and its surroundings beyond the end of section 84. Finally, section 82 provides a matched impedance connection between section 81 and 83. To prevent reflection from the measurement tap, section 83, its buffer amplifier 40 must have a low input impedance compared with the tap impedance. Alternatively compensation for the effect of finite amplifier input impedance is possible, for example by changing the dimensions of the co-axial transmission line conductor. However, it is difficult to ensure that such connections are stable and independent of frequency, and hence design of stable measuring equipment is simplified by the use of a low impedance buffer amplifier.

The tap impedance can be calculated from the current coupled into a grounded capacitive tap. Maintaining a constant impedance design to suppress reflections it follows that for a tap extending from $x_1 - w/2$ to $x_1 + w/2$: (27)

$$i_1 = \int_{x_1 - w/2}^{x_1 + w/2} v(x) \cdot Y \, dx$$

$$= v(x_1) \cdot Y \cdot \left[ \frac{e^{-jkx}}{-jk} \right]_{-w/2}^{+w/2}$$

$$= v(x_1) \cdot Y \cdot \frac{2}{jk} \sinh\left( j \frac{kw}{2} \right)$$

For electrodes that are short compared with the characteristic length, $w << 1\alpha$:

$$i_1 \approx v(x_1) \cdot Y \cdot w \quad (28)$$
$$\approx v(x_1) \cdot j\omega C \cdot w$$

The tap acts as a pure capacitance of magnitude $C_l = C_w$ connected to the central conductor. For longer taps, the current is equivalent to that induced in a short tap displaced towards the source of the transmitted signal. There is little advantage, in terms of coupled signal, in increasing the length of the tap beyond $w = 1\alpha$. It also follows that no particular problems are involved in choosing a tap length that will provide an impedance significantly greater than that achievable for a buffer amplifier constructed using conventional circuit design techniques.

Assuming that section 81 provides a coupling capacitance $C_{in}$,

AC potential coupled onto fibre

AC potential coupled onto fibre $$v_f = v_i \frac{j\omega C_{in} Z_o}{2 + j\omega C_{in} Z_o} \quad (29)$$

If now the length of section 82 is such as to space the measurement tap a distance $D_1$ down the transmission line from the point of injection of the signal provided by oscillator 20, the voltage on the fibre will have decayed from $v_f$ to $v_{f1}$, where $$v_{f1} = v_f e^{-jkD_1} \quad (30)$$

Assuming that section 83 provides a coupling capacitance $C_1$, the signal current $i_1$ coupled out and fed to the buffer amplifier 40 is given by $$i_1 = v_{f1} j\omega C_1 \quad (31)$$

Thus the transfer admittance $$\frac{i_1}{v_i} = -\omega^2 \frac{C_1 C_{in} Z_o}{2 + j\omega C_{in} Z_o} e^{-j\beta D_1} e^{-\alpha D_1} \quad (32)$$

This shows that the coupling falls at low frequencies because the capacitative taps act as a high pass filter. At high frequencies, the attenuation term $e^{-\alpha D_1}$ dominates, and the signal again falls. This results in an ambiguous output at small values of the transfer admittance, although this may not be important if the conductance is restricted to a small range of values. Another disadvantage is that the output is very nonlinear, because $Z_o$, $\alpha$ and $\beta$ all depend on the fibre conductance and are all functionally dependent upon the square root of R, the resistance per unit length of the carbon coated fibre.

Figure 9:
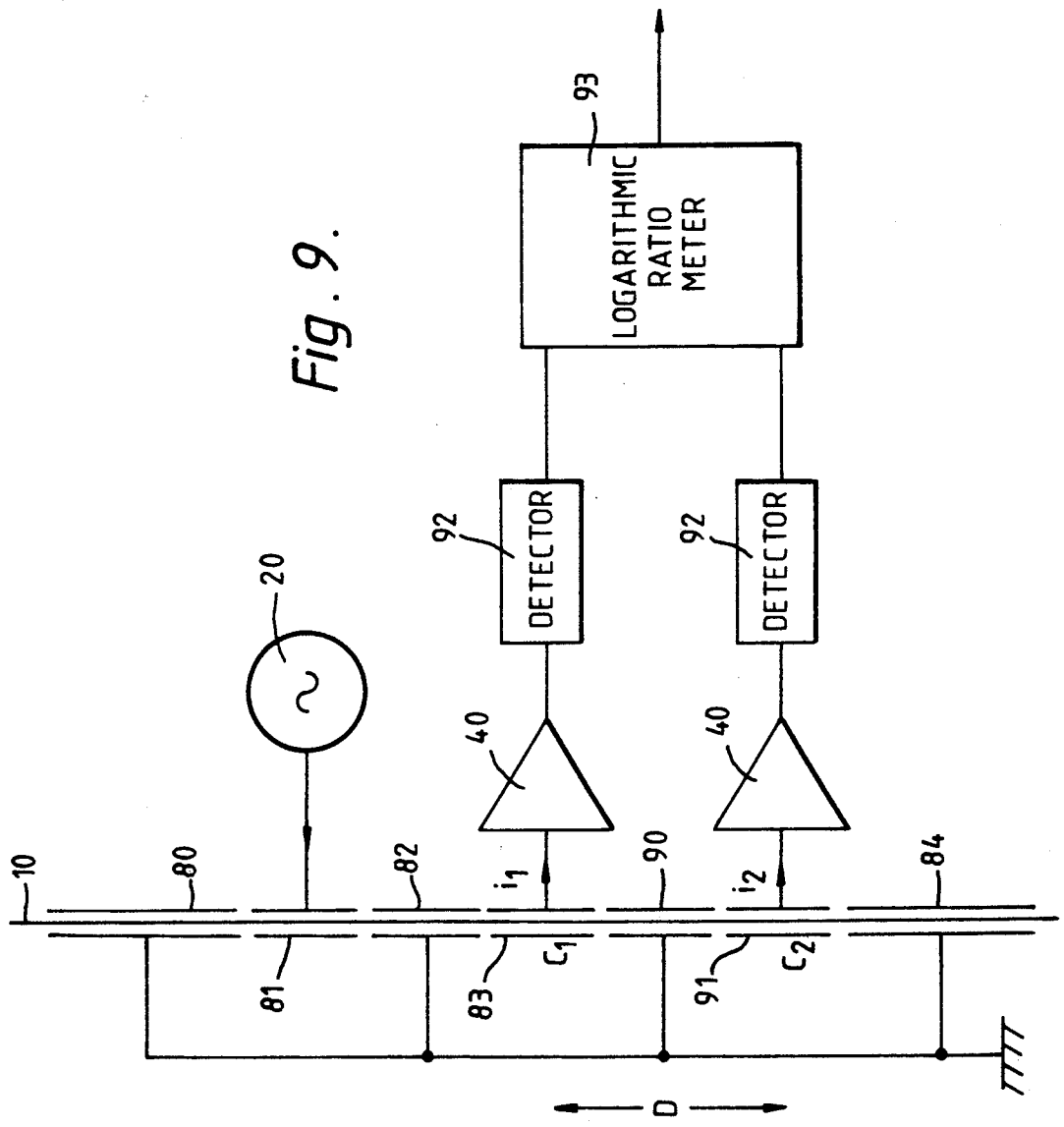
FIG. 9 is a diagram of a resistance meter which is a transmission line equivalent of the meter of FIG. 4.

The ambiguity in deducing the fibre conductance is resolved if two taps are used, as shown in FIG. 9. This meter has the same components as the meter of FIG. 8, but includes two additional sections 90, 91 of conductive tubing. Section 91 provides a second measurement tap, and is connected to a second buffer amplifier 40. Section 90 spaces section 91 from section 83. The two buffer amplifiers 40 are connected respectively to detectors 92, and the outputs of those detectors are fed to a logarithmic ratio unit 93. The ratio of tap currents is $$\frac{i_2}{i_1} = \frac{C_2}{C_1} e^{-j\beta D} e^{-\alpha D} \quad (33)$$

where D is the separation between the two taps. For identical tap capacitances, $C_1$ and $C_2$, provided that termination effects are suppressed, the ratio depends only on the transmission line characteristics, the frequency, and the separation of the taps. The resistance per unit length of the coated fibre can be calculated from $\alpha$ via the amplitude ratio.

Provided that Q is very much smaller than unity, equations (4) and (13) give the relationship:

Fibre resistance per unit length $$R \approx \frac{2\alpha^2}{\omega C} \quad (34)$$

$$\approx \frac{2}{\omega C} \left\{ \frac{1}{D} \ln \left| \frac{i_1 C_2}{i_2 C_1} \right| \right\}^2$$

As an alternative to calculating the value of resistance per unit length of the fibre from a measure of $\alpha$ via the amplitude ratio, the same value can be calculated from a measure of $\beta$ via the relative phases. For this purpose the two detectors 32 are replaced by limiters, and a phase meter is substituted for the logarithmic ratio unit 93.

In the foregoing analysis it is assumed implicitly that the oscillator frequency, $\omega$, and the geometric configuration of the electrodes, both remain constant. This imposes limits on the accuracy attainable at both high and low values of the fibre resistance per unit length, R. For small R, the tap currents $i_1$ and $i_2$, are nearly equal, and small changes in their magnitude or relative phase will give large errors in the calculated value of R. Such changes may arise from lateral shifts in the fibre position, or from changes in stray capacitances, particularly if the transmission line sections 80 and 84 are not considerably longer than the electrode separation, D.

When R is large, $i_2$ will be very much smaller than $i_1$ due to the exponential variation of the tap current with separation D, and propagation constant. At first this will increase the susceptibility to errors from pick-up of the oscillator signal via stray capacitance, inadequate screening, or imperfect power supply decoupling. For very high fibre resistances, the tap signal will fall below the intrinsic noise in the tap amplifier.

The configuration show in FIG. 9 should be able to handle a 10:1 range of fibre conductance without resort to unusual measures to ensure accuracy and repeatability. If a greater dynamic range is required, then one option is to switch the oscillator frequency, giving more than one measurement range.

Figure 10:
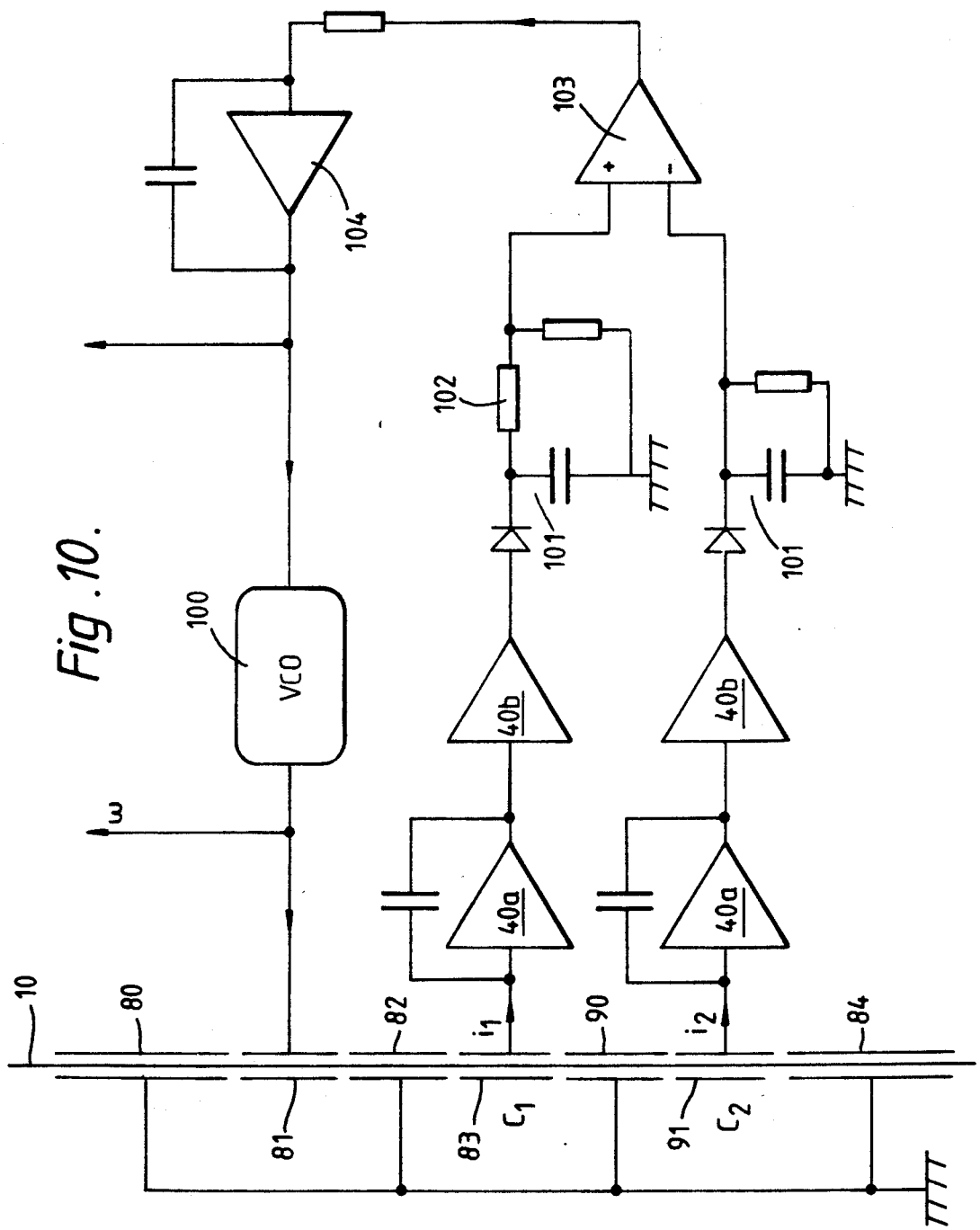
FIG. 10 is a diagram of a modified form of the meter of FIG. 9 incorporating a feedback loop to control the frequency of the signal injected on to its transmission line.

FIG. 10 shows an alternative configuration in which the frequency $\omega$ is varied continuously to maintain a constant ratio between the tap currents $i_1$ and $i_2$. This meter has the same arrangement of seven sections of conductive tube as the meter of FIG. 9. The oscillator 20 is replaced with a voltage controlled oscillator 100. The buffer amplifiers are constituted in this instance by two-stage amplifiers 40a and 40b.

Miller integrator amplifiers are preferred for the first stages since, with suitable commercially available integrated circuit amplifiers, this configuration has low noise and a low input impedance, which minimise the sensitivity to stray capacitances. Simple diode rectifier stages 101 receive the outputs of the second stages 60b. The rectifier stage for the first measurement tap includes an additional resistor 102 to form a potential divider bringing the value of its output to a level comparable with the output of the other rectifier stage. Precision rectifier stages or square law circuits may be used instead. The details are not critical since, as explained below, the voltage signal is independent of frequency to first order. It may be advantageous to operate both rectifiers at a similar drive voltage if a highly linear output is desired. In this case the potential divider would be omitted, and the gain of the voltage amplifier in the first channel would be reduced. A difference amplifier 103 produces an error signal proportional to $(P.i_1 - i_2)$, where P is the ratio of the gains of the two tap amplifier channels. The error signal is integrated at 104, and used to control the frequency of the voltage controlled oscillator 100 which injects a high level ac signal into the fibre transmission line.

With appropriately chosen time constants, the frequency delivered by the voltage controlled oscillator 100 will track the fibre conductance. Similar results are possible using a phase comparator, but care is needed to avoid errors due to phase ambiguities. The circuit is a closed loop system which attempts to maintain a constant ratio $i_1/i_2$. The propagation constants, $\alpha$ and $\beta$ are therefore constant.

$$\alpha^2 \approx \frac{\omega RC}{2} \approx \text{constant} \quad (36)$$

$$Z_0 \approx (1-j)\frac{\alpha}{\omega C} \quad (37)$$

It follows that the voltage injected into the fibre is a constant fraction of the oscillator voltage, and that the voltage output from the miller integrator pre-amplifier 40a stages is also independent of frequency. Under conditions of practical interest, the stray impedances $Z'_A$ and $Z'_B$ are almost purely capacitive. Errors in the tap currents due to reflection from the ends of the transmission line depend on the ratio of the stray impedances to the characteristic impedance $Z_o$, and these ratios are independent of frequency.

The fibre conductance is given by:

$$\frac{1}{R} = \frac{\omega C}{2\alpha^2} \quad (38)$$

and is directly proportional to the frequency. C depends only on the ratio of the fibre diameter to the bore of the transmission line, with a small correction if the fibre has a dieletric coating such as an epoxy-acrylate layer. To first order, stray capacitance will cause a change in the measured value of which is independent of conductance and frequency. In other words, the scale factor may be different from that calculated from first principles, but will be constant throughout the measuring range.

In the case of a specific example of the meter of FIG. 10 required to measure fibre conductance in the range 0.2 to $5.10^{-6}$ Sm, i.e. fibre resistance between $5M\Omega m^{-1}$ and $0.2 M\Omega m^{-1}$, and required to fit within a 50 cm length on an optical fibre draw tower (not shown) a bore diameter of 5 mm was chosen for the conductive tubing as a compromise between efficient coupling and a requirement for low sensitivity to lateral displacement of the 125 μm diameter fibre. For 125 μm diameter fibre, this provides a calculated value of capacitance per unit length, $C = 15$ pF $m^{-1}$. The chosen value for the ratio $i_1/i_2$ is $e \approx 2.7$, so that $\alpha D = 1$. The lengths s of the transmission line sections 80 and 84 should satisfy $2\alpha s >> 1$ for low sensitivity to stray capacitance. Choosing for $\alpha$ the value 12.5 $m^{-1}$, D = 0.08 m. This is achieved by making sections 83, 90 and 91 each 4 cm long. The tap capacitances $C_1$ and $C_2$ are therefore 0.6 pF. Sections 81 and 82 are also each 4 cm long, enabling sections 80 and 84 both to be made 15 cm long. For a fibre resistance of $1M\Omega m^{-1}$, the frequency output will be 1.6 MHz. To cover the fibre conductance range 0.2 to $5.10^{-6}$ Sm, the voltage controlled oscillator 100 has to sweep from 330 kHz to 8.3 MHz.

We claim:

1. A contactless method of measuring the electrical resistance per unit length of a filament, in which method the filament is made the inner conductor of a co-axial transmission line and a measure of the resistance per unit length of the filament is derived from measuring a propagation constant of a signal injected on to that line, wherein the outer conductor of said co-axial transmission line, whose inner conductor is formed by the coated filament, is divided into a plurality of electrically discrete sections arranged in echelon along the filament, wherein a measure of said resistance per unit length is derived from a measure of a propagation constant of the transmission line, which propagation constant is determined by injection an alternating signal on to the transmission line by way of one of said discrete sections of outer conductor and analysing the resulting signal appearing at one other of said discrete sections.

2. A method as claimed in claim 1, wherein the amplitude of the resulting signal appearing at said one other of said discrete sections is compared with the amplitude of the signal appearing at a further one of said discrete sections.

3. A method as claimed in claim 2, wherein the comparison is employed in a feedback loop to control the frequency of the injected alternating signal.

4. A method as claimed in claim 1, wherein the phase of the resulting signal appearing at said one other of said discrete sections is compared with the phase of the signal appearing at a further one of said discrete sections.

5. A method as claimed in claim 4, wherein the comparison is employed in a feedback loop to control the frequency of the injected alternating signal.

6. A resistance meter for measuring the electrical resistance per unit length of a filament, which meter includes the outer conductor of a co-axial transmission line whose inner conductor is constituted by the filament, which outer conductor is divided into a plurality of electrically discrete sections, wherein an oscillator is connected to one of the sections for applying an alternating signal to the transmission line, and wherein measuring means is connected to one other of said sections, which measuring means is adapted to measure the resulting signal appearing at the section to which the measuring means has been connected.

7. A resistance meter as claimed in claim 6, wherein said measuring means that is connected to said one other of said sections is also connected to a further one of said sections, which measuring means is adapted to compare the resulting signals appearing at said one other section and said further one of said sections.

8. A meter as claimed in claim 7, wherein the measuring system is adapted to compare the amplitudes of said resulting signals.

9. A meter as claimed in claim 8, wherein the measuring means has an output connected in a feedback loop path which is adapted to control the frequency of the oscillator.

10. A meter as claimed in claim 7, wherein the measuring system is adapted to compare the relative phases of said resulting signals.

11. A meter as claimed in claim 10, wherein the measuring means has an output connected in a feedback loop path which is adapted to control the frequency of the oscillator.

12. A contactless method of measuring the thickness of a coating applied to a filament, wherein the filament is electrically insulating and of known diameter and wherein the coating is an electrically conductive coating of known resistivity, in which method the thickness is derived from a measure of the resistance per unit length of the coated filament, which measure is made by making the coated filament the inner conductor of a co-axial transmission line, and a measure of the resistance per unit length of the coated filament is derived from measuring a propagation constant of a signal injected on to that line, wherein the outer conductor of said co-axial transmission line whose inner conductor is formed by the coated filament is a conductor divided into a plurality of electrically discrete sections arranged in echelon along the coated filament, wherein a measure of said coating thickness is derived from a measure of a propagation constant of the transmission line, which propagation constant is determined by injecting an alternating signal on to the transmission line by way of one of said discrete sections of outer conductor and analysing the resulting signal appearing at one other of said discrete sections.

13. A method as claimed in claim 12, wherein the amplitude of the resulting signal appearing at said one other of said discrete sections is compared with the amplitude of the signal appearing at a further one of said discrete sections.

14. A method as claimed in claim 13, wherein the comparison is employed in a feedback loop to control the frequency of the injected alternating signal.

15. A method as claimed in claim 12, wherein the phase of the resulting signal appearing at said one other of said discrete sections is compared with the phase of the signal appearing at a further one of said discrete sections.

16. A method as claimed in claim 15, wherein the comparison is employed in a feedback loop to control the frequency of the injected alternating signal.

* * * * *